(12) United States Patent
Huang et al.

(10) Patent No.: US 7,368,373 B2
(45) Date of Patent: *May 6, 2008

(54) METHOD FOR MANUFACTURING SEMICONDUCTOR DEVICES AND PLUG

(75) Inventors: Min-San Huang, Hsinchu (TW); Dah-Chuan Chen, Hsinchu County (TW); Rex Young, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 249 days.

This patent is subject to a terminal disclaimer.

(21) Appl. No.: 11/162,081

(22) Filed: Aug. 29, 2005

(65) Prior Publication Data

US 2006/0183311 A1    Aug. 17, 2006

(30) Foreign Application Priority Data

Feb. 16, 2005    (TW) .............................. 94104420 A

(51) Int. Cl.
*H01L 21/3205* (2006.01)
*H01L 21/4763* (2006.01)

(52) U.S. Cl. .................... 438/589; 438/267; 438/270; 438/597; 257/E21.495

(58) Field of Classification Search ................ 438/270, 438/299, 301, 303, 304, 589, 596, 597, 267
See application file for complete search history.

(56) References Cited

U.S. PATENT DOCUMENTS

| 6,531,350 | B2 * | 3/2003 | Satoh et al. ................. 438/197 |
| 6,656,825 | B2 * | 12/2003 | Burbach ...................... 438/596 |
| 6,943,082 | B2 * | 9/2005 | Shibata ........................ 438/259 |
| 6,967,143 | B2 * | 11/2005 | Mathew et al. ............. 438/304 |
| 6,972,260 | B2 * | 12/2005 | Huang et al. ............... 438/700 |
| 7,098,124 | B2 * | 8/2006 | Huang et al. ............... 438/597 |
| 2003/0186552 | A1 * | 10/2003 | Amano et al. .............. 438/694 |
| 2005/0037585 | A1 * | 2/2005 | Park et al. .................. 438/305 |

* cited by examiner

*Primary Examiner*—Michael Lebentritt
*Assistant Examiner*—Angel Roman
(74) *Attorney, Agent, or Firm*—Jianq Chyun IP Office

(57) ABSTRACT

A method for manufacturing a semiconductor device is disclosed suitable for a substrate having a first conducting structure and a first dielectric layer, wherein the dielectric layer covers the first conductive structure. The method includes the steps of forming a second conductive structure over the substrate adjacent to the first conductive structure. Then, the size of the second conductive structure is reduced so that a top surface of the second conductive structure is relatively lower than that of the first conductive structure. Thereafter, a second dielectric layer is formed over the substrate to cover the first and the second conductive structure. A via is formed in the second dielectric layer to expose the top surface of the first conductive structure. Finally, a via plug is formed in the via.

8 Claims, 4 Drawing Sheets

METHOD FOR MANUFACTURING SEMICONDUCTOR DEVICES AND PLUG

CROSS-REFERENCE TO RELATED APPLICATION

This application claims the priority benefit of Taiwan application serial No. 94104420, filed on Feb. 16, 2005. All disclosure of the Taiwan application is incorporated herein by reference.

BACKGROUND OF THE INVENTION

1. Field of the Invention

The present invention generally relates to a fabrication method of a semiconductor device. More particularly, the present invention relates to a fabrication method of a metal interconnect for a semiconductor device.

2. Description of Related Art

The higher the level of integration for integrated circuits, the smaller the semiconductor devices are being developed. Therefore, the size of the devices, for example, the width of the conducting line, the size of the gate, and the dimension of the plug shrinks to increase the level of integration. However, due to the miniaturizing of component devices, the difficulties in the manufacturing process greatly increase, and the demand for size precision also increases.

According to the conventional photolithography and etching processes, a misalignment often occurs during photolithography process in forming a contact window opening that exposes the source/drain region or a gate or a via that exposes the surface of an interconnect in the dielectric layer of a memory device (ex: a flash memory) or an interconnect (ex: a conducting line), due to the increase of the level of integration and the miniaturization of the device dimension. Furthermore, the misalignment during the photolithography process often leads to an exposure of other component devices neighbouring to the source/drain region, the gate or the interconnect, designated to be exposed.

Turning to FIG. 1, FIG. 1 illustrates the cross sectional views of the contact window openings for exposing a gate and a source region of the conventional trench flash memory. The conventional fabrication method for forming the contact window openings that respectively expose the drain region and the gate region of the trench flash memory includes forming a trench gate structure 102 on a substrate 100, forming a gate dielectric layer 104 on the trench gate structure 102, forming a select gate 106 on both a portion of the gate dielectric layer 104 which is at the sides of the trench gate structure 102 and on the substrate 100, forming spacers 108 on the side walls of the select gate 106. Afterwards, in the substrate 100, a drain region 110 is formed at two sides of the trench gate structure 102 and the selected gate 106. Furthermore, a dielectric layer 112 is formed on the substrate 100, then a photolithography and etching process is performed to create contact window openings 114 and 116 in the dielectric layer 112. The contact window opening 114 exposes a portion of the drain region 110 and the contact window opening 116 exposes a portion of the trench gate 102.

As expressed in the FIG. 1, while a misalignment or an inaccurate alignment occurs during a photolithography process, the contact window opening 114 and 116 expose not only the assigned surfaces of the trench gate structure and the drain region, but also a portion of neighbouring surface 106a next to the select gate 106. Therefore, while forming contact plugs in the contact window 114 and the 116, the contact plugs are connected to the exposed select gate 106 through abnormal electrical connection, leading to current leakage for the device, and abnormal electrical performance.

SUMMARY OF THE INVENTION

Generally speaking, the present invention is directed to provide a fabrication method for a semiconductor device, wherein the conducting device not intended to be electrically connected to the upper conducting structure is relatively lower than the conducting device intended to be electrically connected to the upper conducting structure. Therefore, an abnormal connection between the plug and the conducting device which is not predetermined to form an electrical connection with the upper conducting structure can be prevented. Current leakage or abnormal electrical performance can also be prevented.

In accordance to one aspect of the present invention, a fabrication method of a semiconductor device is provided. The method includes providing a substrate, forming a first conducting structure and a first dielectric layer on the first conducting structure, forming a second conducting structure and a spacer at the side wall of the first conducting structure covered by the first dielectric layer. The second conducting structure is formed between the spacer and the first conducting structure and between the spacer and the substrate. Thereafter, a portion of the second conducting structure is removed such that the upper surface of the second conducting structure is relatively lower than the upper surface of the first conducting structure to thereby form a first depression between the spacer and the first conducting structure. A second depression is formed due to the second conducting structure, which is disposed between the spacer and the substrate, being receded towards the side wall of the first conducting structure. Afterwards, the second dielectric layer is formed on the substrate to fill in the first depression and the second depression. Furthermore, a via is formed in the second dielectric layer to expose the upper surface of the first conducting structure. Finally, a plug is formed in the via.

According to the fabrication method of an embodiment in the present invention, the method for removing a portion of the second conducting structure includes a wet etching process, and the etching solution includes a mixture of ammonia solution and hydrogen peroxide. The composition ratio of the ammonia solution, hydrogen peroxide and water in the etching solution ranges between 1~5:1:100~500. Besides, the temperature of the ammonia-hydrogen peroxide solution is about 70~90° C. Particularly, the etching selectivity of the material for the second conducting structure is different from those of the first dielectric layer and the spacer. The material of the second conducting structure is selected from the group consisting of polysilicon, silicide, and polysilicon/silicon tungsten.

In accordance to another aspect of the present invention, a fabrication method of the via plug in the trench flash memory is provided, and the fabrication method is suitable for a substrate containing a trench type flash memory. The trench type flash memory includes source/drain regions in the substrate, a trench gate structure disposed in the substrate but protruded from the surface of the substrate, a gate dielectric layer covering the trench gate structure, a select gate and a spacer on the trench gate structure covered by the gate dielectric layer, wherein the select gate is disposed between the spacer and the trench gate structure and between the spacer and the substrate. The fabrication method includes removing a portion of the select gate for the upper surface of the select gate to be relatively lower than the upper surface of the trench gate structure to form a first depression between the spacer and the first conducting structure. A second depression is formed due to the second conducting structure, which is disposed between the spacer and the substrate, being receded towards the side wall of the first conducting structure. Afterwards, the second dielectric layer is formed on the substrate to fill in the first depression and the second depression. Furthermore, in the dielectric layer, a first via and a second via are formed, where the first via exposes the source/drain regions, and the second via exposes the upper surface of the trench gate structure. Finally, a first via plug and a second via plug are formed in the first via and the second via, respectively.

According to the fabrication method of the embodiment in the present invention, the method for removing a portion of the select gate includes a wet etching process, wherein the etching solution is includes a mixture of ammonia solution and hydrogen peroxide. The composition ratio of the ammonia solution, hydrogen peroxide and water in the etching solution ranges between 1~5:1:100~500. Besides, the temperature of the ammonia-hydrogen peroxide solution is about 70~90° C. In particular, the etching selectivity of material for the select gate is different from those of the gate dielectric layer and the spacer. The material for the select gate is selected from the group consisting of polysilicon, silicide, and polysilicon/silicon tungsten.

In accordance to yet another aspect of the present invention, a fabrication method of a plug is provided, and the fabrication method is suitable for a substrate already formed with a first conducting structure and a first dielectric layer, wherein the dielectric layer covers the first conducting structure. The fabrication method involves in forming a second conducting structure at the side of the first conducting structure and on the substrate, reducing the size of the second conducting structure for the upper surface of the second conducting structure to be relatively lower than the upper surface of the first conducting structure, forming a second dielectric layer on the substrate to cover the first conducting structure and the second conducting structure, forming a via in the second dielectric layer, and forming a via plug in the second dielectric layer.

According to an embodiment of the plug fabrication method of the present invention, the method for reducing the size of the second conducting structure includes a wet etching process, wherein the etching solution is formed with a mixture of ammonia solution and hydrogen peroxide. The ratio of the ammonia solution, hydrogen peroxide and water in the etching solution ranges between 1~5:1:100~500. Further, the temperature of the ammonia-hydrogen peroxide solution is about 70~90° C. In particular, the etching selectivity of the material for the second conducting structure is different from those for the gate dielectric layer and the spacer. The material for the second conducting structure is selected from the group consisting of polysilicon, silicide, and polysilicon/silicon tungsten.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The First Embodiment

According to the present invention, the foregoing general description and the following detailed description of an embodiment with reference to the accompanying drawings are exemplary and explanatory for a plug fabrication of a trench type flash memory process. This invention, however, may be embodied in many different forms and should not be construed as limited to the embodiments set forth herein. The present invention is applicable to any process that is related to the formation of a plug in a dielectric layer, wherein the plug is electrically connected to an adjacent device underneath.

FIG. 2A to FIG. 2D are schematic cross sectional views showing the steps for fabricating a plug according to an embodiment of the present invention, wherein the plug is formed in the dielectric layer and is electrically connected to the trench type flash memory.

Figure 1:
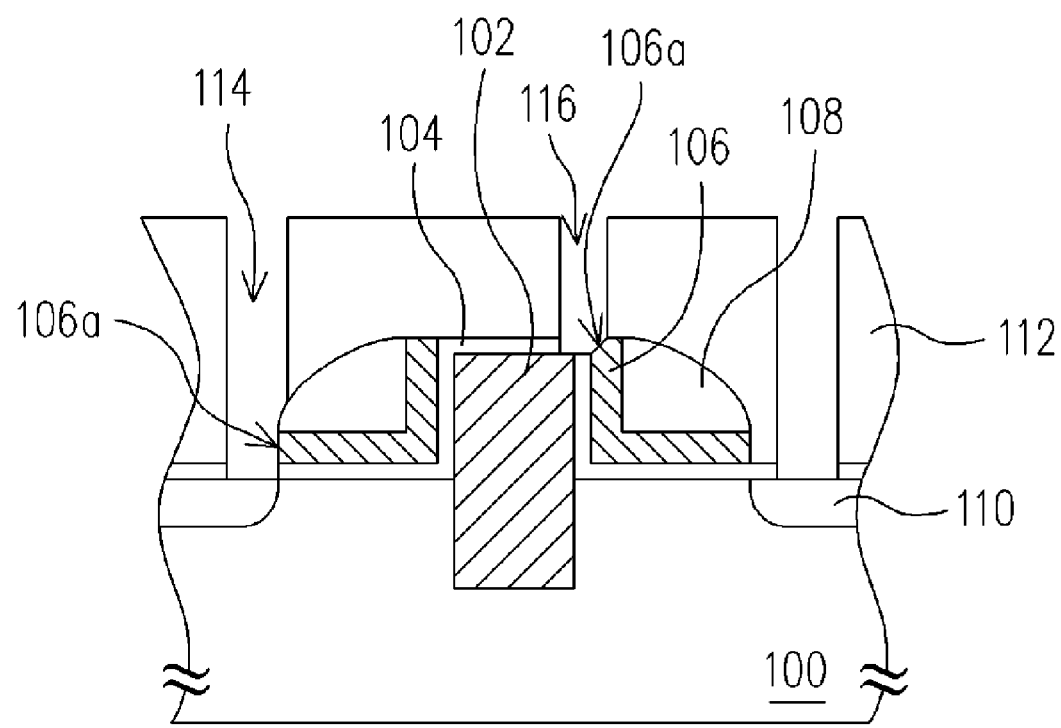
FIG. 1 is a schematic cross sectional view of the conventional trench type flash memory device with a contact opening that exposes a gate and a contact opening that exposes a drain region.
Figure 2A:
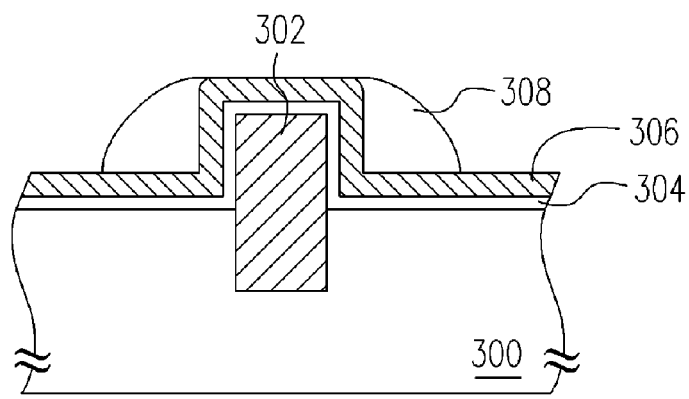
FIG. 2A~FIG. 2D are schematic cross sectional views according to an embodiment of the present invention showing the steps for fabricating a plug, where the plug is formed in the substrate and electrically connected to the component device of the trench type flash memory.

Please referring to FIG. 2A, a substrate 300 that includes the trench gate structure 302 is provided, wherein the trench gate structure 302 can further include a tunnel oxide layer (not shown in the figures), a floating gate (not shown in the figures), a gate dielectric layer (not shown in the figures), and a control gate. Moreover, a gate dielectric layer 304 is formed on the substrate 300 to cover the trench gate structure 302, wherein the material for the gate dielectric layer 304 is, for example, silicon oxide. Thereafter, a conducting layer 306 is formed on the gate dielectric layer 304, and selected from the group consisting of polysilicon and silicide; more preferable the material for the conducting layer 306 is polysilicon/silicon tungsten. Afterwards, an insulating layer (not shown in the figures) is formed on the conducting layer 306, and a spacer 308 is formed at the side wall of the conducting layer 306 by removing a portion of insulating layer. The material for the spacer 308 is, for example, silicon nitride. It is noteworthy to be mentioned that the etching ratio for the materials of the spacer 308 and the gate dielectric layer 304, and the conducting layer are significantly different.

Figure 2B:
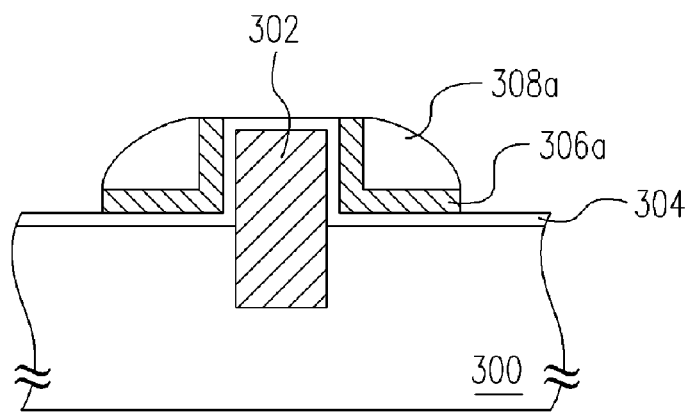

Please turning to FIG. 2B, after removing a portion of the conducting layer 306 and a portion of the spacer 308, the upper part of the trench gate structure 302 and a portion of the gate dielectric layer 304 on the substrate 300 are exposed, and a select gate 306a and a spacer 308a are formed. Accordingly, the select gate 306a is disposed between the spacer 308a and the trench gate structure 302, and between the spacer 308a and the substrate 300. Besides, the method for removing a portion of the conducting layer 306 and a portion of the spacer 308 includes an isotropic etching process.

Figure 2C:
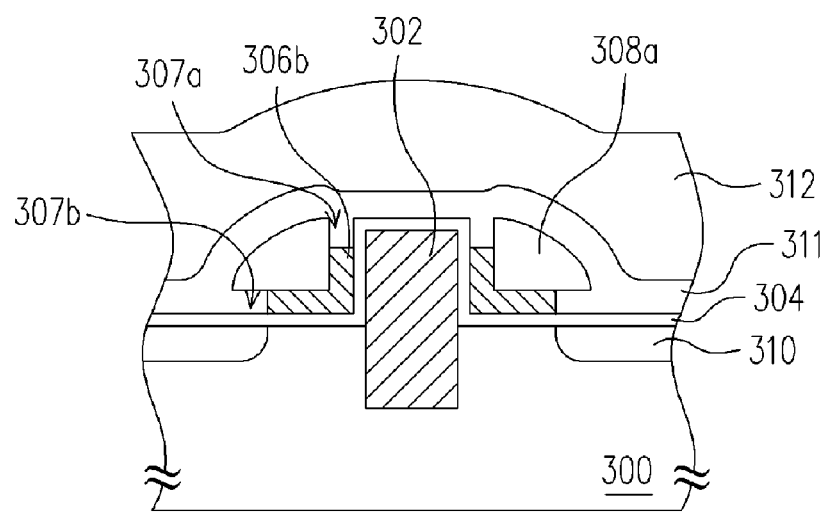

Next turning to the FIG. 2C, an etching process is performed to remove a portion of the select gate 306a; therefore, the select gate 306b is relatively lower than the spacer 308a and the trench gate 302. At the same time, the select gate 306b disposed underneath the spacer 308a recedes towards the side wall of the trench gate structure 302. In other words, the upper surface of the select gate 306b is lower than the upper surface of the trench gate structure 302 to form a depression 307a between the spacer 308a and the trench gate structure 302. Another depression 307b is formed due to the recession of the select gate 306b disposed between the spacer 308a and the substrate 300 towards the trench gate 302. Moreover, an etching process is performed by using an ammonia-hydrogen peroxide solution to conduct a wet etching process and the composition ratio of ammonia, hydrogen peroxide and water in the ammonia-hydrogen peroxide solution ranges between 1~5:1:100~500, respectively the temperature for the ammonia-hydrogen peroxide solution is preferably between 70~90° C. It is noteworthy to be mentioned that the method for removing the portion of the select gate 306a includes an etching process, and the etching selective ratio for the select gate 306b (same material for the conducting layer 306) is higher; therefore, a portion of the select gate 306a can be selectively removed to form the selected gate 306b without affecting the spacer 308a and the exposed gate dielectric layer 304.

Continuing with the above description, a drain region 310 is formed in the substrate 300 beside the two sides of the trench gate structure 302, the select gate 306b and the spacer 308a. Thereafter, a dielectric layer 311 is formed on the substrate 300 filling the depression 307a and the depression 307b. The material for the dielectric layer 311 is, for example, silicon nitride. Furthermore, a dielectric layer 312 is formed on the dielectric layer 311.

Figure 2D:
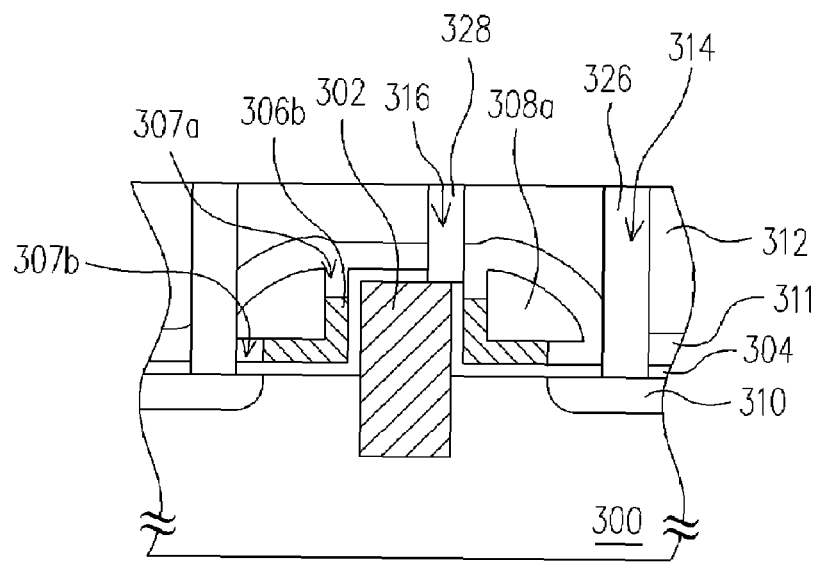

Please referring to FIG. 2D, sequentially performing a planarization process, a photolithography process and an etching process, contact window openings 314 and 326 are formed in the dielectric layer 312 and 311. The surface of the drain region 310 is exposed by the contact window opening 314 and the surface of the trench gate 302 is exposed by the contact window 316. Thereafter, the contact plugs 328 and 326 are formed in the contact window openings 314 and 316 to electrically connect to the trench gate structure 302 and the drain region 310, respectively.

In accordance to the embodiment of the present invention, the material for the gate dielectric layer 304 is, for example, silicon oxide; the material for the dielectric layer 311 is, for example, silicon nitride; the material for the dielectric layer 312 is, for example, silicon oxide. The fabrication processes for contact window 316 includes removing a portion of the dielectric layer 312 using the dielectric layer 311 as the etching stop layer and removing a portion of dielectric layer 311 by applying the gate dielectric layer 304 as the etching stop layer to, followed by removing a portion of the gate dielectric layer 304 to expose the trench gate structure 302. In comparison with the neighbouring select gate 306b and the trench gate structure 302, the select gate 306b is lower. Therefore, even if a misalignment occurs during the photolithography process, leading to a deviation of the position of the contact window opening, the select gate 306b which is adjacent to the trench gate structure 302 is still not being exposed by the contact window opening 316 during the formation of the contact window opening 316 to expose the surface of the trench gate structure 302.

In the similar manner, the select gate 306b is receded towards the sidewall of the trench gate structure 302; therefore, even a misalignment occurs during the photolithography process leading a deviation of the position of the contact window opening, the select gate 306b which is adjacent to the drain region 310 is still not being exposed by the contact window opening 314, during the formation of the contact window 314 to expose the upper surface of the drain region 310. Afterwards, the plugs 326 and 328 which are formed in the contact window openings 314 and 316 will not contact the component devices that are not intended for (ex; the select gate 306b of the embodiment) to result with an abnormal electrical contact. Therefore, the problems often occurred in the prior art due to the higher level of the integration for the device, such as, a misalignment during the photolithography process or an insufficient accuracy for the alignment, can be resolved to prevent a current leakage or an abnormal electrical performance due to the unintentional electrical connection with the adjacent devices. In addition, the insulating ability between the select gate and the trench gate structure can be improved.

According to the above embodiment, the fabrication method of the plug 326 can be achieved through the self-alignment contact window process.

The Second Embodiment

According to the present invention, the foregoing general description and the following detailed description of the embodiment with reference to the accompanying drawings are exemplary and explanatory for the fabrication of plugs during the interconnect processing. This invention, however, may be embodied in many different forms and should not be construed as limited to the embodiments set forth herein. The present invention is applicable to any process that is related to the formation of a plug in a dielectric layer, wherein the plug is electrically connected to an adjacent device underneath.

FIG. 3A to FIG. 3D are schematic cross sectional views showing the steps of fabrication of a plug fabrication in an interconnect manufacturing process according to another embodiment of the present invention, wherein the plug is formed in the dielectric layer and is electrically connected to the conducting structure at the lower level.

Figure 3A:
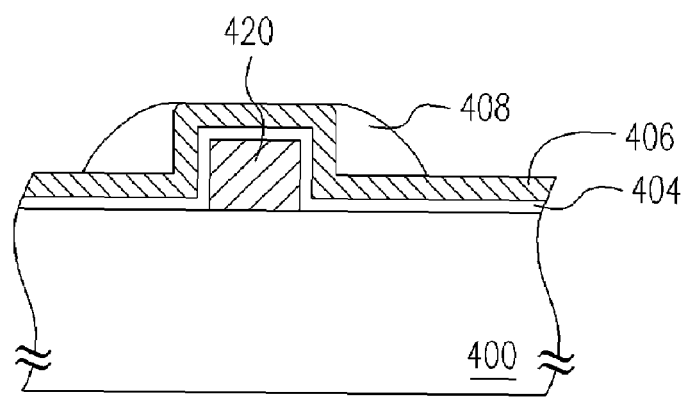
FIG. 3A~FIG. 3D are schematic cross sectional views according to an embodiment of the present invention showing the steps for fabricating a plug, where the plug is formed in the dielectric layer and electrically connected to the lower layers of the conducting structure.

Please referring FIG. 3A, a substrate 400 including a conducting structure 402 is provided. A dielectric layer 404 is formed on the substrate 400 to cover the conducting structure 420, and the material for the dielectric layer 404 is, for example, silicon oxide. Thereafter, a conducting layer 406 is formed on the gate dielectric layer 404 and the material for the conducting layer 406 is selected from the group consisting of polysilicon and silicide. More preferable the material for the conducting layer 406 is formed with polysilicon/silicon tungsten. Afterwards, an insulating layer (not shown in the figures) is formed on the conducting layer 406, and a spacer 408 is formed at the side wall of the conducting layer 406 by removing a portion of insulating layer. The material for the spacer 408 is, for example, silicon nitride. It is noteworthy to be mentioned that the etching ratio for the materials of the spacer 408 and the dielectric layer 404, and the conducting layer are significantly different.

Figure 3B:
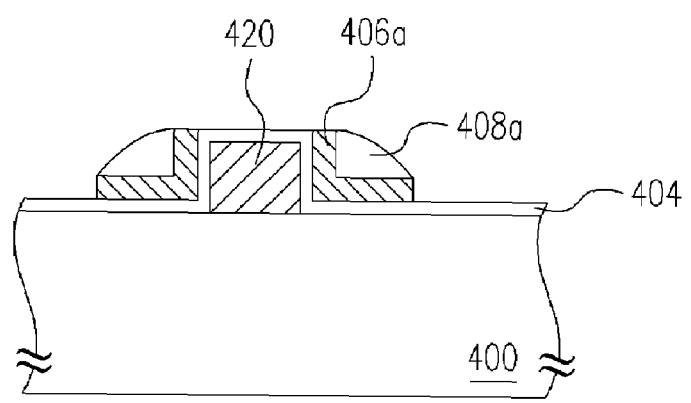

Please turning to FIG. 3B, after removing a portion of the conducting layer 406 and a portion of the spacer 408, an upper part of the conducting structure 420 and a portion of the dielectric layer 404 on the substrate 400 are exposed. A conducting structure 406a and a spacer 408a are thereby formed. Therefore, the conducting structure 406a is disposed between the spacer 408a and the conducting structure 420, and between the spacer 408a and the substrate 400.

Besides, the method for removing the portion of the conducting layer 406 and the portion of the spacer 408 includes an anisotropic etching process.

Figure 3C:
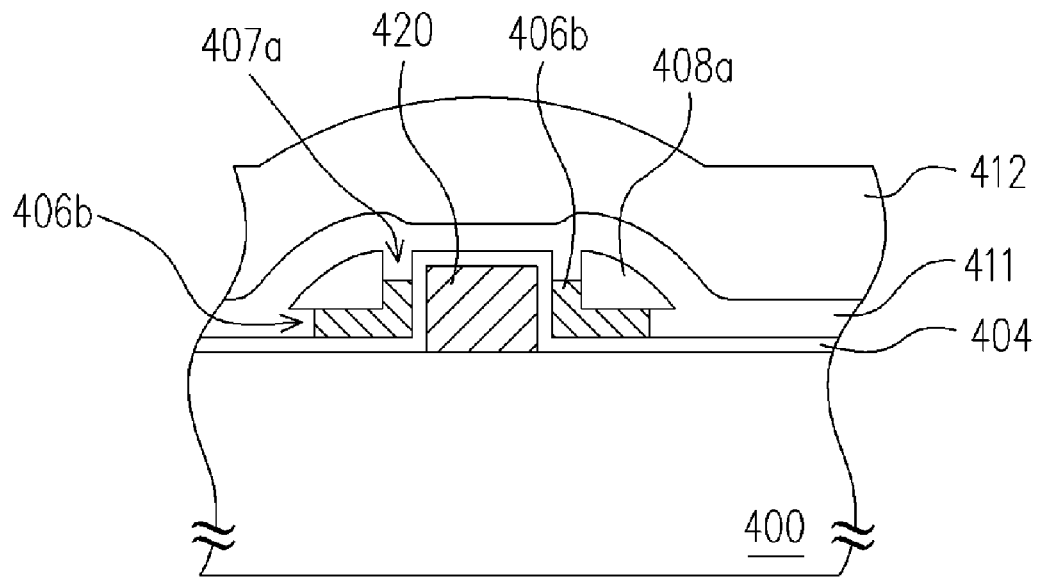

Next turning to the FIG. 3C, an etching process is performed to remove a portion of the conducting structure 406a to form the conducting structure 406b that is relatively lower than the spacer 408a and the conducting structure 420. At the same time, the conducting structure 406b disposed underneath the spacer 408a is receded towards the side wall of the conducting structure 420. In other words, the upper surface of the conducting structure 406b is lower than the upper surface of the conducting structure 420 to form a depression 407a between the spacer 408a and the conducting structure 420. Another depression 407b is formed due to the recession of the conducting structure 406b between the spacer 408a and the substrate 400 towards the conducting structure 420. Moreover, an etching process includes a wet etching process using an ammonia-hydrogen peroxide solution, and the composition ratio of ammonia, hydrogen peroxide and water in the ammonia-hydrogen peroxide solution ranges between 1~5:1:100~500. The temperature of the ammonia-hydrogen peroxide solution ranges between 70~90° C.; more preferable at the temperature of 85° C. It is noteworthy to be mentioned that the method for removing the portion of the conducting structure 406a is an etching process, and the etching selective ratio for the conducting structure 406b (same material for the conducting layer 406) is higher; therefore, the portion of the conducting structure 406a can be selectively removed to form the conducting structure 406b without affecting the spacer 408a and the exposed dielectric layer 404.

Continuing with the above description, a dielectric layer 411 is formed on the substrate 400 to fill the depression 407a and the depression 407b. The material for the dielectric layer 411 is, for example, silicon nitride. Furthermore, a dielectric layer 412 is formed on the dielectric layer 411.

Figure 3D:
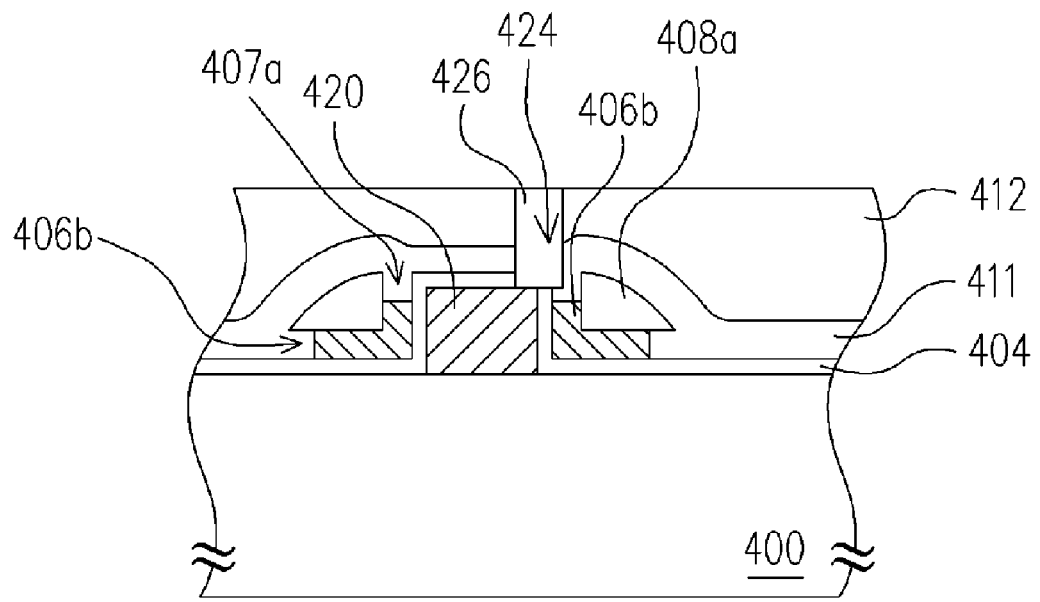

Please referring to FIG. 3D, an opening 424 is formed in the dielectric layer 412 and 411, and the opening 424 exposes the surface of the conducting structure 420. Thereafter, the plug 426 is formed in the opening 424; and the plug 426 is electrically connected to the conducting structure 420.

In accordance to the embodiment of the present invention, the material for the dielectric layer 404 is, for example, silicon oxide; the material for the dielectric layer 411 is, for example, silicon nitride; the material for the dielectric layer 412 is, for example, silicon oxide. The fabrication processes for opening 424 is by using the dielectric layer 411 as the etching stop layer to remove a portion of the dielectric layer 412, applying the dielectric layer 404 as the etching stop layer to remove a portion of dielectric layer 411, and removing a portion of the dielectric layer 404 to expose the conducting structure 420. Regarding the neighbouring conducting structures 406b and 420, the conducting structure 406b is lower. Therefore, even if a misalignment occurred during a photolithography process leading to a deviation of the position of the contact window opening, the conducting structure 406b which is adjacent to the conducting structure 420 is still not being exposed by the opening 424. Accordingly, the plug 426 subsequently formed in the opening 424 will not electrically contact the component device that are not intended for (ex; the conducting gate 406b in the embodiment) to result with an abnormal electrical contact.

In conclusion of the above description, the present invention at least provides the following advantages:

(1) According to the plug fabrication method in a trench type flash memory manufacturing process of the present invention, by using the significant differences of the etching selective ratio between the materials for the select gate, spacer and the gate dielectric layer, a portion of select gate is removed to have the select gate lower than the trench gate structure. Further, the select gate is receded towards the side wall of the trench gate structure. Therefore, even a misalignment or insufficient alignment accuracy occurred during the photolithography process, and the position of the contact window is formed deviated, the component device which is not intended for electrical connection, will not be exposed. Furthermore, the current leakage or abnormal electrical performance due to the unintended electrical connection can be prevented. In addition, the insulating ability between the select gate and the trench gate structure can be improved.

(2) According to the plug fabrication method in a trench type flash memory manufacturing process of the present invention, by using materials that have significant differences in the etching selective ratios for the conducting structure, the dielectric layer and the spacer, a portion of conducting structure is removed to have the conducting structure lower than the conducting structure which is predetermined to be electrically connected. Further, the conducting structure is receded towards the side wall of the conducting structure which is predetermined to be electrically connected. Therefore, even a misalignment or insufficient alignment accuracy occurred during the photolithography process, and the position of the contact window is formed deviated, the component device which is not intended for electrical connection will not be exposed. Furthermore, a current leakage or abnormal electrical performance due to the unintentional electrical connection can be prevented.

(3) The plug fabrication of the present invention, by using materials that have significant differences in the etching selective ratios for the conducting material and the dielectric layer, the conducting device not intended to be electrically connected to the upper layer of the conducting structure is lower than the conducting device which is predetermined to be electrically connected to the upper layer of the conducting structure. Therefore, when a via or a contact window opening is formed in the dielectric layer, the conducting device, which is not intended to be electrically connected to the upper layer of the conducting structure but is neighbored to the conducting device predetermined to be electrically connected to the upper layer of the conducting structure, will not be exposed. Furthermore, the unintended electrical connection between the plug subsequently formed and the conducting device not predetermined to be electrically connected to the upper layer of the conducting structure can be prevented. A current leakage or an abnormal electrical performance can be obviated.

It will be apparent that the above mentioned description with attached figures are exemplary and explanatory for the objects, specification and merits of the present invention only, and are not restrictive of the invention, those skilled in the art that various modifications and variations can be made to the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a semiconductor device, comprising:

providing a substrate having a trench type flash memory formed thereon, wherein the trench flash memory comprises:

a trench gate structure, disposed in the substrate and protruded from a surface of the substrate;

a gate dielectric layer, covering the trench gate structure;

a spacer, disposed on a side wall of the trench gate structure covered by the gate dielectric layer; and a select gate, disposed between the spacer and the trench gate structure and between the spacer and the substrate;

removing an exposed portion of the select gate for an upper surface of the select gate to be lower than an upper surface of the trench gate structure to form a first depression between the spacer and the trench gate structure and for the select gate which is disposed between the spacer and the substrate to recede toward the side wall of the trench gate structure to form a second depression;

forming a dielectric layer above the substrate to cover the trench type flash memory and fill the first depression and the second depression.

2. The fabrication method of the semiconductor device as recited in claim 1, further comprising:

forming a first contact window opening in the dielectric layer, wherein the first contact window exposes source/drain regions of the trench gate structures; and forming a first contact window plug in the first contact window opening.

3. The fabrication method of the semiconductor device as recited in claim 2, further comprising:

forming a second contact opening, wherein the second contact window opening exposes an upper surface of the trench gate structure; and forming a second contact window plug in the second contact window opening.

4. The fabrication method of the semiconductor device as recited in claim 1, wherein a method for removing the portion of the select gate comprises an isotropic etching process.

5. The fabrication method of the semiconductor device as recited in claim 4, wherein an etching solution for the isotropic etching process includes an ammonia-hydrogen peroxide solution.

6. The fabrication method of the semiconductor device as recited in claim 5, wherein a composition ratio of ammonia, hydrogen peroxide and water for the isotropic etching process in the ammonia-hydrogen peroxide solution ranges between 1~5:1:100~500, respectively.

7. The fabrication method of a semiconductor device as recited in claim 5, wherein a temperature of the ammonia-hydrogen peroxide solution ranges between 70~90° C.

8. The fabrication method of a semiconductor device as recited in claim 2, wherein a material for the select gate is selected from the group consisting of polysilicon, silicide, and polysilicon/silicon tungsten.

* * * * *